US012389564B2

(12) United States Patent
Sanada (10) Patent No.: US 12,389,564 B2
(45) Date of Patent: Aug. 12, 2025

(54) COOLING DEVICE OF ELECTRONIC EQUIPMENT

(71) Applicant: TOSHIBA TEC KABUSHIKI KAISHA, Tokyo (JP)

(72) Inventor: Tsuyoshi Sanada, Susono Shizuoka (JP)

(73) Assignee: TOSHIBA TEC KABUSHIKI KAISHA, Tokyo (JP)

( * ) Notice: Subject to any disclaimer, the term of this patent is extended or adjusted under 35 U.S.C. 154(b) by 232 days.

(21) Appl. No.: 18/337,067

(22) Filed: Jun. 19, 2023

(65) Prior Publication Data

US 2024/0206114 A1 Jun. 20, 2024

(30) Foreign Application Priority Data

Dec. 20, 2022 (JP) ................. 2022-202904

(51) Int. Cl.
*H05K 7/20* (2006.01)
(52) U.S. Cl.
CPC ..... *H05K 7/20172* (2013.01); *H05K 7/20145* (2013.01); *H05K 7/20154* (2013.01); *H05K 7/20409* (2013.01)
(58) Field of Classification Search
CPC ... H01L 23/3672; H01L 23/4093; G06F 1/20; G06F 1/206; G06F 2200/201; G06F 1/203; H05K 7/20154; H05K 7/20145; H05K 7/2039; H05K 7/20172; H05K 7/20409; H05K 7/20727; H05K 7/20745; F24F 1/0029; F24F 1/0059; F24F 13/082; F24F 13/20; F24F 2013/0616; B60H 1/00042; B60H 1/00; B01D 2267/70; B01D 2273/14; B01D 2279/50; B01D 46/0006; B01D 46/12; B01D 46/18; F28D 2021/0029; F28D 5/00

See application file for complete search history.

(56) References Cited

U.S. PATENT DOCUMENTS 5,504,651 A * 4/1996 Atarashi ............... H01L 23/467
257/722
5,592,363 A * 1/1997 Atarashi ............... H01L 23/467
361/689

(Continued)

FOREIGN PATENT DOCUMENTS

JP 2003-283171 10/2003

*Primary Examiner* — Michael A Matey
(74) *Attorney, Agent, or Firm* — Amin, Turocy & Watson, LLP (57) ABSTRACT

A first air blowing unit rotates to blow air and includes a first discharge surface for discharging the air. A second air blowing unit rotates to blow the air and includes a second discharge surface for discharging the air. A heat sink includes a plurality of fins. Edges on an upstream side in an air blowing direction of the fins are opposed to the first discharge surface or the second discharge surface. The edges of the fins located on a downstream side of a boundary between the first discharge surface and the second discharge surface are located closer to the first discharge surface and the second discharge surface than the other edges. A duct covers the heat sink, the first air blowing unit, and the second air blowing unit and includes a suction port on the upstream side and an exhaust port on the downstream side.

20 Claims, 6 Drawing Sheets

(56) References Cited

U.S. PATENT DOCUMENTS

| | | | | |
|---|---|---|---|---|
| 6,478,082 B1* | 11/2002 | Li | F28F 13/003 | 257/E23.102 |
| 6,498,395 B2* | 12/2002 | Baek | H01L 23/467 | 257/722 |
| 7,040,384 B2* | 5/2006 | Shiang-Chich | H01L 23/4093 | 165/104.34 |
| 7,333,341 B2* | 2/2008 | He | H01L 23/4006 | 361/719 |
| 7,414,842 B2* | 8/2008 | Hao | H01L 23/467 | 257/E23.099 |
| 7,492,590 B2* | 2/2009 | Chen | H05K 7/20172 | 174/16.3 |
| 7,515,414 B2* | 4/2009 | Horng | H01L 23/467 | 361/695 |
| 2005/0041392 A1* | 2/2005 | Chen | H05K 7/20727 | 361/695 |
| 2007/0035926 A1* | 2/2007 | Xia | H01L 23/467 | 257/E23.099 |
| 2007/0091566 A1* | 4/2007 | Sun | G06F 1/20 | 361/695 |
| 2007/0097630 A1* | 5/2007 | Lee | H01L 23/427 | 257/E23.099 |
| 2007/0119567 A1* | 5/2007 | Yeh | H01L 23/467 | 361/699 |
| 2007/0165374 A1* | 7/2007 | Chen | H01L 23/467 | 257/E23.099 |
| 2007/0256433 A1* | 11/2007 | Bhatti | F24F 1/035 | 62/304 |
| 2008/0062641 A1* | 3/2008 | Lai | H01L 23/467 | 257/E23.099 |
| 2008/0123293 A1* | 5/2008 | Yu | H01L 23/467 | 361/695 |
| 2009/0129018 A1* | 5/2009 | Zhou | H01L 23/467 | 361/697 |
| 2009/0139691 A1* | 6/2009 | Wei | H01L 23/467 | 165/80.3 |
| 2010/0006278 A1* | 1/2010 | Fan | H01L 23/3677 | 428/323 |
| 2011/0132582 A1* | 6/2011 | Cheng | F04D 25/166 | 165/185 |
| 2012/0057300 A1* | 3/2012 | Tan | H01L 23/467 | 361/697 |
| 2013/0223007 A1* | 8/2013 | Nakajima | H05K 7/20336 | 361/697 |
| 2014/0251322 A1* | 9/2014 | Miller | A61M 16/0891 | 128/201.13 |
| 2015/0219348 A1* | 8/2015 | Ikeda | F24F 1/0018 | 415/206 |
| 2016/0187041 A1* | 6/2016 | Yoshikawa | F25D 21/14 | 62/81 |
| 2018/0008926 A1* | 1/2018 | Oishi | F24F 13/20 | |

* cited by examiner

COOLING DEVICE OF ELECTRONIC EQUIPMENT

CROSS-REFERENCE TO RELATED APPLICATION

This application is based upon and claims the benefit of priority from Japanese Patent Application No. 2022-202904, filed on Dec. 20, 2022, the entire contents of which are incorporated herein by reference.

FIELD

Embodiments described herein relate generally to a cooling device of electronic equipment.

BACKGROUND

Electronic equipment such as a PC (Personal Computer) includes a component heated to high temperature such as a CPU (Central Processing Unit). In general, a heat sink is attached to such a component in order to radiate heat. Air sucked by a fan installed on an upstream side flows to the heat sink and is discharged to a downstream side of the heat sink, whereby the heat radiation is performed.

Recently, there are increasing demands for a reduction in the size of electronic equipment. A reduction in the size of a cooling fan that blows air to a heat sink is demanded. However, if the cooling fan is reduced in size, since a discharge volume of cooling air decreases, cooling performance of the heat sink is undesirably deteriorated.

DETAILED DESCRIPTION

An aspect of embodiments is to provide a cooling device of electronic equipment capable of realizing a reduction in the size of a cooling fan without reducing a discharge volume of cooling air.

A cooling device of electronic equipment according to an embodiment includes a first air blowing unit, a second air blowing unit, a heat sink, and a duct. The first air blowing unit forms a flow of air by rotating to blow the air and includes a first discharge surface for discharging the air. The second air blowing unit forms a flow of the air by rotating to blow the air, includes a second discharge surface for discharging the air, and is installed adjacent to the first air blowing unit. The heat sink has width smaller than a sum of a diameter of the first discharge surface and a diameter of the second discharge surface, a plurality of fins being erected side by side in a thickness direction in a base section of the heat sink to which heat of an electronic component conducts. Edges on an upstream side in an air blowing direction of the fins are opposed to the first discharge surface or the second discharge surface. The edges of the fins located on a downstream side of a boundary between the first discharge surface and the second discharge surface are located closer to the first discharge surface and the second discharge surface than the other edges. The duct covers the heat sink, the first air blowing unit, and the second air blowing unit and includes a suction port on the upstream side and an exhaust port on the downstream side in the air blowing direction by the first air blowing unit and the second air blowing unit.

Figure 1:
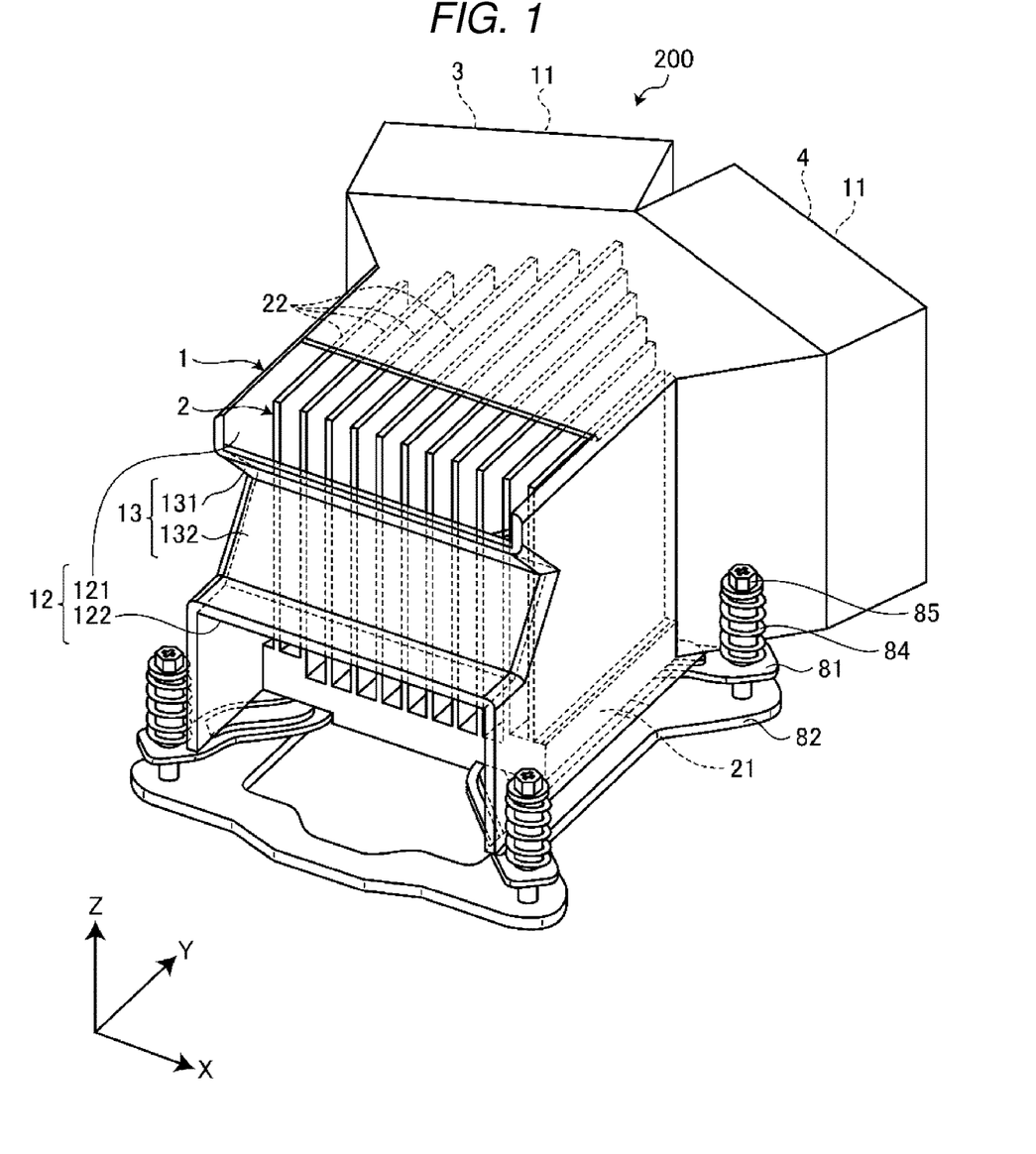
FIG. 1 is a perspective view illustrating an example of an exterior of a cooling device in an embodiment.
Figure 2:
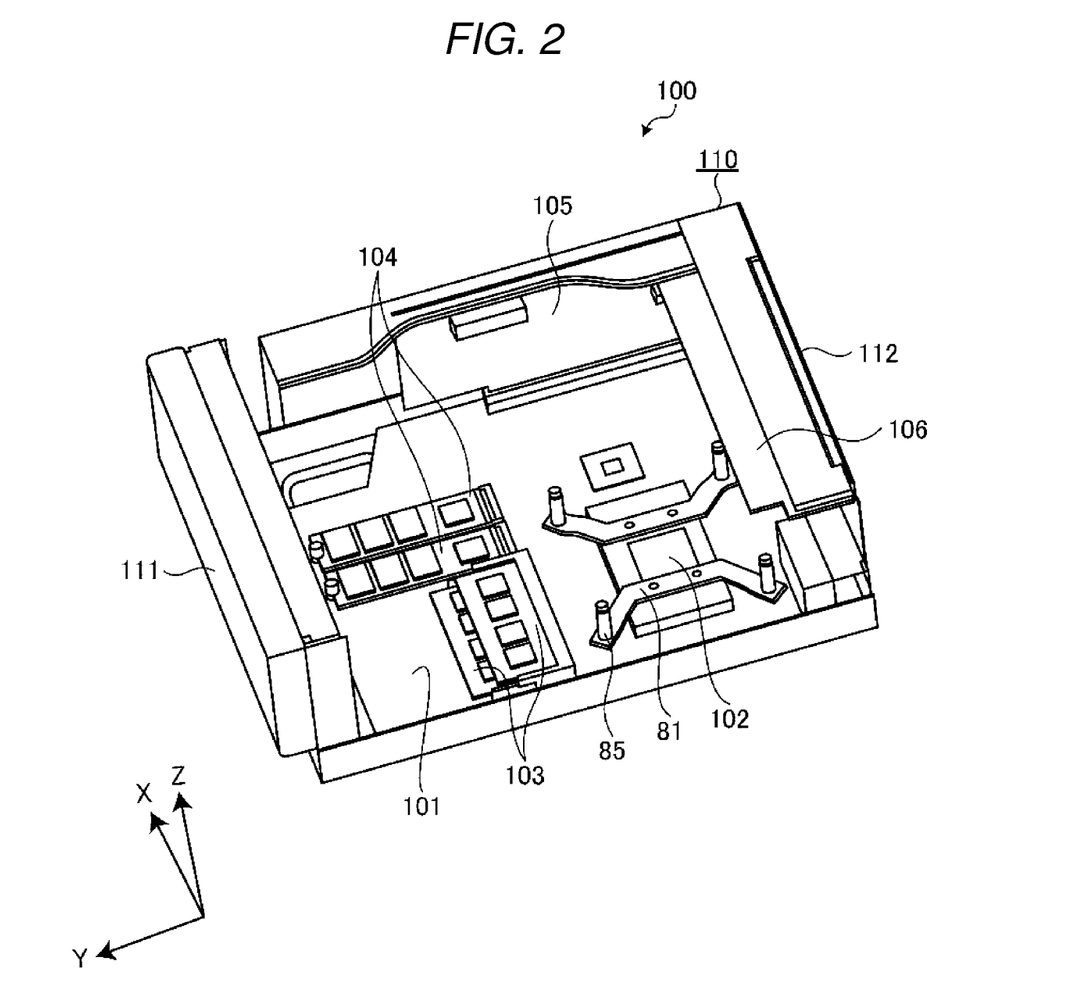
FIG. 2 is a perspective view schematically illustrating an example of the structure of electronic equipment to which the cooling device is attached.

An embodiment is explained with reference to the drawings. FIG. 1 is a perspective view illustrating an example of an exterior of a cooling device 200 in a first embodiment. FIG. 2 is a perspective view schematically illustrating an example of the structure of electronic equipment 100 to which the cooling device 200 is attached. For convenience of explanation, a three-dimensional coordinate system is also illustrated in the drawings. In the three-dimensional coordinate system, a width direction (a left-right direction) of the cooling device 200 and the electronic equipment 100 is represented as an X-axis direction, a depth direction (a front-rear direction) thereof is represented as a Y-axis direction, and a height direction (an up-down direction) thereof is represented as a Z-axis direction. Note that a Y-axis positive direction is a direction from the rear side to the front side of the electronic equipment 100. The Y-axis positive direction is referred as "front". A Z-axis positive direction is a down-to-up direction.

First, as illustrated in FIG. 1, the cooling device 200 includes a duct 1, a heat sink 2, and fans 3 and 4. The duct 1 has a substantially box-like shape and covers the heat sink 2 and the fans 3 and 4 that blow air to the heat sink 2. A suction port 11 is provided in a position on an upstream side in an air blowing direction of the fans 3 and 4 in the duct 1. An exhaust port 12 is provided in a position on a downstream side in the air blowing direction. The duct 1 discharges, from the exhaust port 12, air sucked from the suction port 11 by the fans 3 and 4. A flowing direction of the air blown by the fans 3 and 4 is directed to a Y-axis negative direction (the rear) by the duct 1.

In the following explanation, the simple description of the upstream side intends to indicate an upstream side (a windward side) based on a flowing direction of the air in the duct 1 (the Y-axis negative direction). Similarly, the simple description of the downstream side intends to indicate a downstream side (a downwind side) based on the flowing direction of the air in the duct 1.

The heat sink 2 is generally formed of a metal material having high thermal conductivity such as aluminum or copper and is attached to an electronic component (a heat source) that generates heat. The heat source is, for example, a CPU (Central Processing Unit). Heat generated by the CPU conducts to the heat sink 2. Heat of the heat sink 2 is dispersed to the air around the heat sink 2. Consequently, malfunction and the like due to overheat of the CPU are prevented.

The heat sink 2 includes a base section 21 and a plurality of fins 22. The base section 21 receives conduction of heat emitted by the electronic component. The plurality of fins 22 are provided to be erected side by side in the thickness direction on the base section 21. The plurality of fins 22 are adjacent to one another at predetermined intervals from one another. The base section 21 is in contact with the CPU and receives the conduction of the heat of the CPU. The fins 22 emit (radiate), to the air, the heat conducting from the base section 21 that is continuous to the fins 22. The air flowing in the duct 1 passes among the fins 22 of the heat sink 2, whereby the heat radiation is accelerated.

The heat sink 2 is fixed, by helical springs 84 and screws 85, on frames 81 and 82 formed in layers at a predetermined interval. A motherboard 101 (see FIG. 2) is sandwiched between the frame 81 and the frame 82.

The fan 3 is an example of the first air blowing unit in the present disclosure. The fan 4 is an example of the second air blowing unit in the present disclosure. The fan 3 includes a first discharge surface 32 for discharging the air sucked from the outside toward the heat sink 2. The fan 4 includes a second discharge surface 42 for discharging the air sucked from the outside toward the heat sink 2.

The fan 3 and the fan 4 in this embodiment have the same size, pass the center position in the width direction of the heat sink 2 along an X axis and are disposed symmetrically with respect to a surface parallel to the fins 22 (a surface parallel to a YZ plane) at an included angle of 90 degrees or more.

The fans 3 and 4 are axial fans and continuously blow the air by driving to rotate, for example, with conduction motors, propellers including one or more blades around rotating shafts. The air blown by the fans 3 and 4 forms a flow of the air among the fins 22. The air blown by the fans 3 and 4 carries the heat emitted by the fins 22 and the base section 21 to the downstream side and accelerates the heat radiation. In this way, the fans 3 and 4 cool the heat sink 2.

In this embodiment, the suction port 11, the fan 3 or the fan 4, the heat sink 2, the exhaust port 12 are disposed in this order from the upstream side toward the downstream side in the air flowing direction in the duct 1. The air sucked from the suction port 11 and blown by the fans 3 and 4 mainly flows around the fins 22 of the heat sink 2 to take away heat of the fins 22 and is discharged from the exhaust port 12.

The duct 1 causes the air blow by the fan 3 to efficiently act on the heat radiation of the heat sink 2 and improves a heat radiation effect. Specifically, the duct 1 surrounds the heat sink 2 and delimits a range in which the air blown by the fan 3 for cooling the heat sink 2 flows. Gas in the duct 1 is replaced with gas sucked from the suction port 11 by rotation of the fan 3 and is pushed out from the discharge port 12. Consequently, gas around the heat sink 2 is quickly replaced.

In order to sufficiently exert the effects of the cooling device 200 explained above, a component (an obstacle) that hinders exhaust is desirably absent on the downwind side of the exhaust port 12. However, an obstacle is sometimes disposed on the downstream side of the exhaust port 12 depending on the size of the electronic equipment 100 including the cooling device 200, disposition of an object built in the cooling device 200, and the like.

As illustrated in FIG. 2, the electronic equipment 100 includes a motherboard 101, a CPU 102, memories 103, SSDs (Solid State Drives) 104, a riser card 105, an I/O board 106, and a housing 110. The housing 110 houses the units described above (the motherboard 101, the CPU 102, the memories 103, the SSDs 104, the riser card 105, and the I/O board 106).

The motherboard 101 is an example of a substrate on which the electronic component (in this embodiment, the CPU 102), the heat of which is radiated by the heat sink 2, is mounted. Since the memories 103 and the SSDs 104 also generate heat according to operation, the memories 103 and the SSDs 104 can be heat sources. The heat generated by the heat sources is also emitted by the flow of the gas in the housing 110 formed by the air blow of the fans 3 and 4.

The I/O board 106 is connected to the motherboard 101 via an insertion port (a slot) included in the riser card 105. Since the I/O board 106 is disposed in parallel to the mother board 101 by being connected to the insertion port included in the riser card 105, it is possible to suppress a height dimension of the housing 110.

However, if the I/O board 106 is located further on the downstream side than the exhaust port 12 because of the disposition explained above, the I/O board 106 hinders the exhaust. This embodiment is configured such that the exhaust from the duct 1 avoids the I/O board 106.

Figure 3:
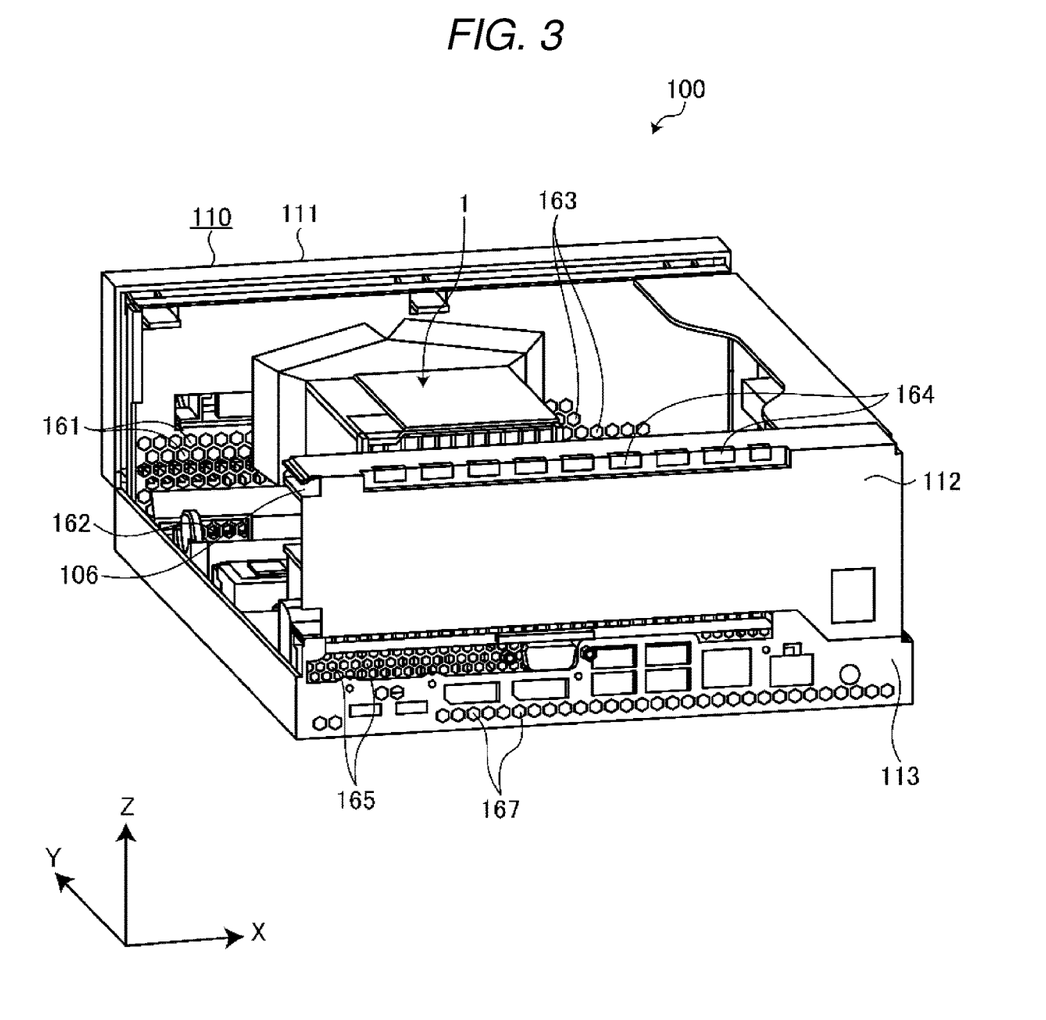
FIG. 3 is a perspective view illustrating an example of vent holes provided in the electronic equipment.

FIG. 3 is a perspective view illustrating an example of vent holes 161 to 167 provided in the electronic equipment 100. The perspective view is a view of the electronic equipment 100 viewed from the rear side.

The duct 1 is housed on the inside of the housing 110 of the electronic equipment 100. In the housing 110, the vent holes 161, 162, and 163 for taking in the air sucked into the inside of the duct 1 and the vent holes 164, 165, and 167 for discharging the air passed through the duct 1 are provided.

The vent holes 161, 162, and 163 are provided in a front cover 111 configuring the front surface of the housing 110. The vent holes 164 are provided in a rear cover 112 configuring the rear surface of the housing 110. The vent holes 165 and 167 are provided in an I/O panel 113 configuring a part of the rear surface of the housing 110. The I/O panel 113 includes connection terminals for connecting various kinds of peripheral equipment to the electronic equipment 100.

In the electronic equipment 100 in this embodiment, the I/O board 106 is disposed behind the CPU 102. Therefore, the exhaust port 12 of the duct 1 is divided into, such that the exhaust avoids the I/O board 106, an upper exhaust port 121 opened upward and a lower exhaust port 122 opened downward (see FIG. 1). Specifically, the exhaust port 12 is divided into the upper exhaust port 121 and the lower exhaust port 122 by a branch wall 13.

Figure 4:
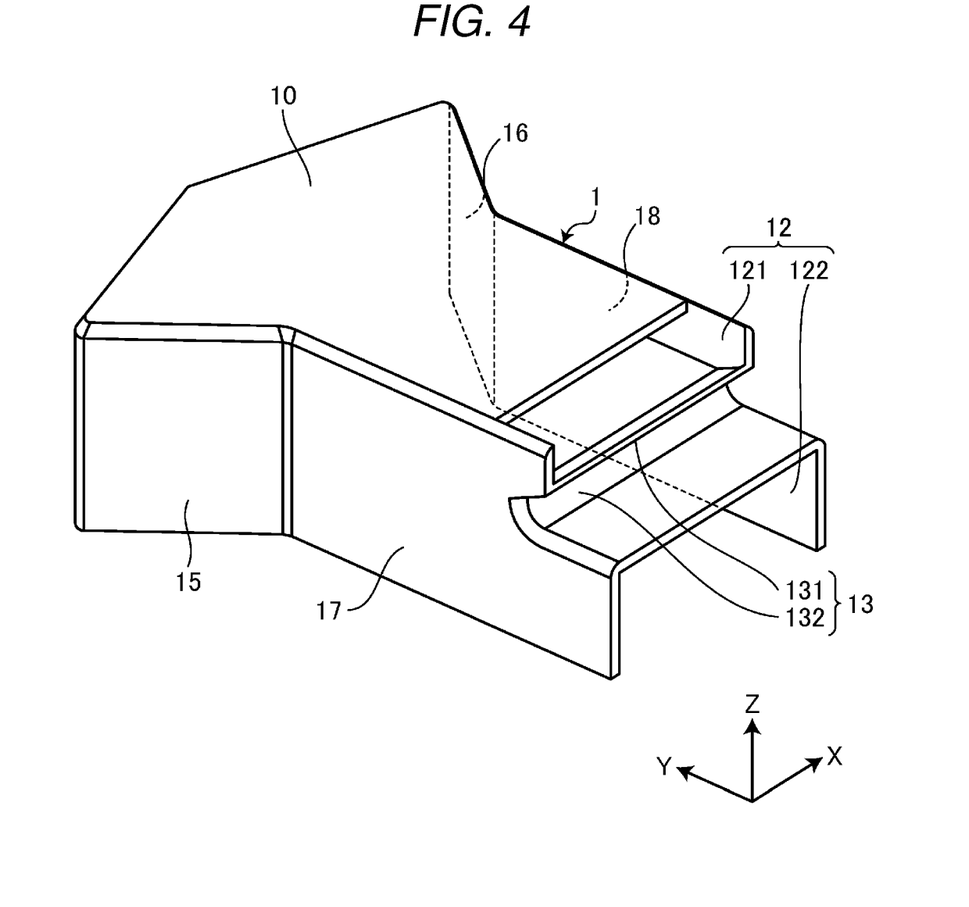
FIG. 4 is a perspective view illustrating an example of a shape of a duct.

FIG. 4 is a perspective view illustrating an example of a shape of the duct 1. The duct 1 has a shape formed by opening a side on which the fan 3 and the fan 4 are attached and the side of the exhaust port 12.

The duct 1 includes a top plate 10 and sidewalls 15 to 18. The top plate 10 configures a Z-axis direction upper part of the duct 1 and is opposed to the distal end portions of the fins 22. The sidewalls 17 and 18 are opposed to both side portions of the heat sink 2. The sidewalls 15 and 16 connect the sidewalls 17 and 18 and side portions of the fans 3 and 4 and surround a space between the fans 3 and 4 and the heat sink 2.

With the duct 1 explained above, the air blown by the fans 3 and 4 reaches the heat sink 2 without leaking from the duct 1. The sidewalls 15 and 16 are examples of a first wall section in the present disclosure.

The branch wall 13 is provided on the downstream side (the Y-axis negative side) of the duct 1. The branch wall 13 includes an upper wall section 131 and a lower wall section 132. The upper wall section 131 and the lower wall section 132 are connected on a side extending along the X axis on the upstream side in the air blowing direction. The upper wall section 131 and the lower wall section 132 are inclined with respect to the air blowing direction such that the distance between the upper wall section 131 and the lower wall section 132 is larger further on the downstream side in the air blowing direction.

The air passed among the fins 22 of the heat sink 2 reaches the branch wall 13. The upper wall section 131 guides, obliquely upward, a part of the air passed among the fins 22 of the heat sink 2 and discharges the part of the air from the upper exhaust port 121. The lower wall section 132 guides, obliquely downward, the remaining air passed among the fins 22 of the heat sink 2 and discharges the remaining air from the lower exhaust port 122. In this way, the branch wall 13 guides the exhaust air to avoid a part of a range on the downstream side of the branch wall 13 and causes the exhaust air to branch. Therefore, even if peripheral equipment such as the I/O board 106 (see FIG. 3) is disposed in a position on the downstream side of the branch wall 13, cooling performance of the heat sink 2 is not hindered.

Figure 5:
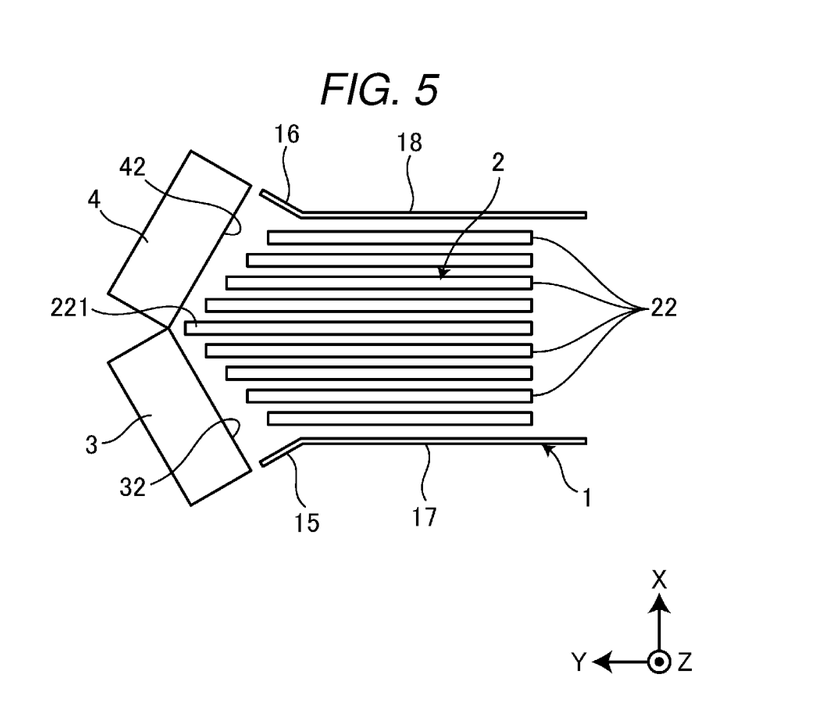
FIG. 5 is a schematic plan view of the cooling device for explaining a relation between a direction of discharge surfaces of fans and a shape of edges of fins.
Figure 6:
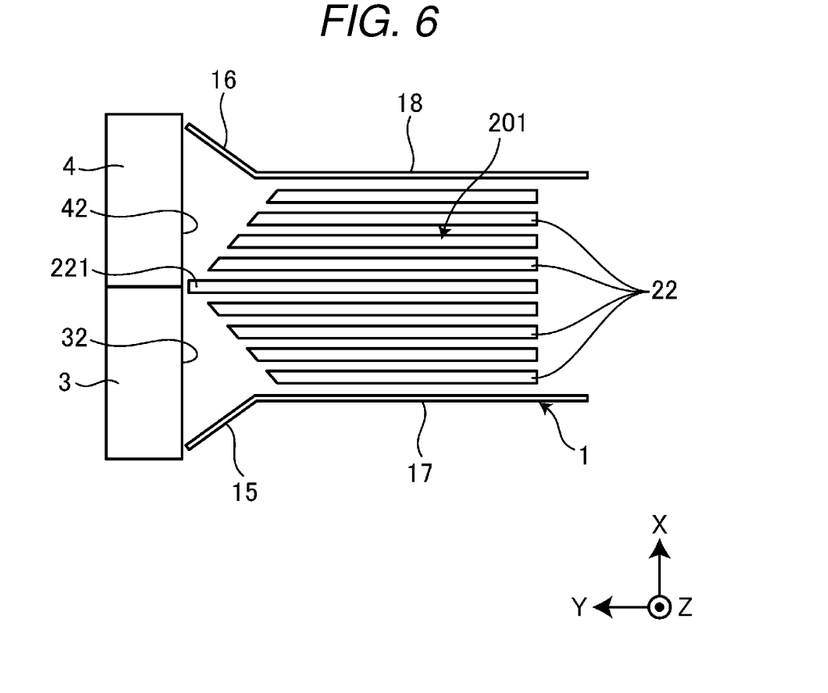
FIG. 6 is a schematic plan view of the cooling device for explaining the relation between the direction of discharge surfaces of the fans and the shape of the edges of the fins.
Figure 7:
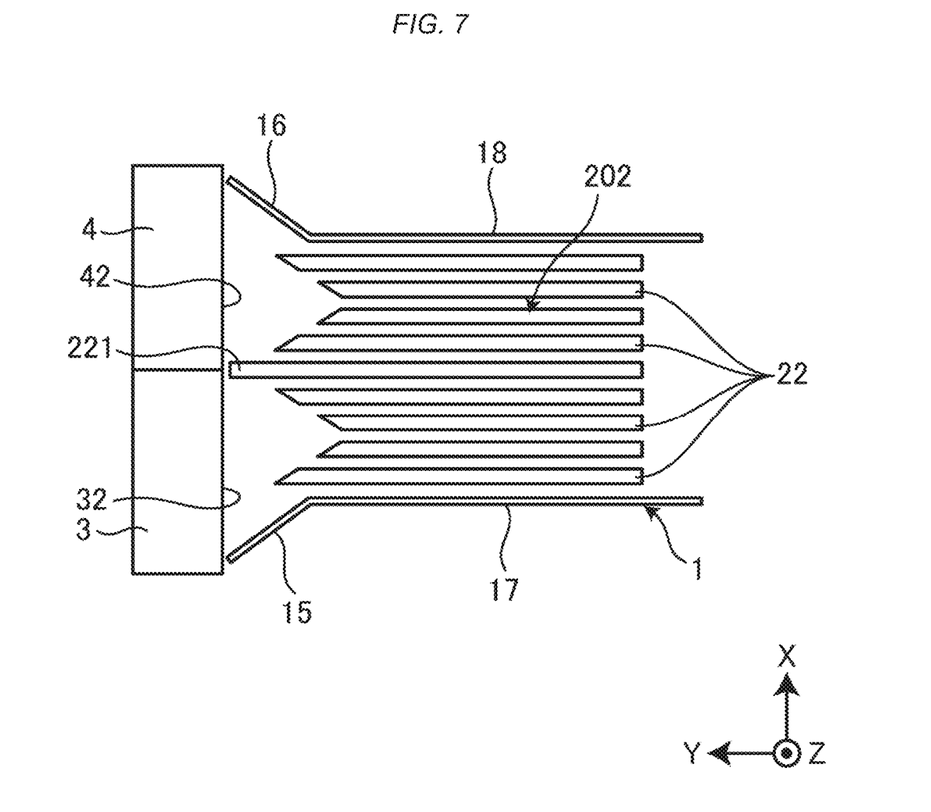
FIG. 7 is a schematic plan view of the cooling device for explaining the relation between the direction of discharge surfaces of the fans and the shape of the edges of the fins.

FIGS. 5, 6, and 7 are schematic plan views of the cooling device 200 for explaining a relation between the directions of the discharge surfaces 32 and 42 of the fans 3 and 4 and the shape of the edges of the fins 22. FIGS. 5 to 7 illustrate examples different from one another.

First, the fans 3 and 4 common to the examples are explained. The fan 3 includes a plurality of blades that rotate around the rotating shaft. The fan 3 discharges, from the first discharge surface 32, the air sucked from the suction port 11. The first discharge surface 32 is a circular region. Similarly, the fan 4 includes a plurality of blades that rotate around the rotating shaft. The fan 4 discharges, from the second discharge surface 42, the air sucked from the suction port 11. The second discharge surface 42 is a circular region.

The fan 3 and the fan 4 have the same size. The size of the fan 3 and the fan 4 is set such that the sum of the diameter of the first discharge surface 32 and the diameter of the second discharge surface 42 is larger than the width of the heat sink 2.

The first discharge surface 32 from which the fan 3 discharges the air and the second discharge surface 42 from which the fan 4 discharges the air are symmetrically disposed across a fin 221 in the center in the width direction of the heat sink 2 (the X-axis direction) on the upstream side of the heat sink 2.

Further, a housing of the fan 3 and a housing of the fan 4 are adjacent to each other without a gap. Therefore, the housing of the fan 3, the housing of the fan 4, the sidewalls 15 and 16, and the top plate 10 (see FIG. 4) surround a space on the upstream side of the heat sink 2. Therefore, the air blown by the fan 3 and the fan 4 reaches the heat sink 2 without leaking to the outside of the duct 1.

The sidewalls 15 and 16 of the duct 1 are provided to gradually reduce the interval between the sidewalls 15 and 16 in a part from the suction port 11 to the heat sink 2. Therefore, the air blown by the fan 3 is directed to the center in the width direction along the sidewall 15 and the air blown by the fan 4 is directed to the center in the width direction along the sidewall 16.

Subsequently, the example illustrated in FIG. 5 is explained. In the heat sink 2 in this example, edges on a side opposed to the first discharge surface 32 or the second discharge surface 42 (edges of the fins 22 on the upstream side in the air blowing direction) of the fins 22 are located along a ridge-shaped imaginary line projecting in the center in an arranging direction of the fins 22 (the X-axis direction). In other words, the edges on the side opposed to the first discharge surface 32 or the second discharge surface 42 of the fins 22 are located to draw a ridge shape projecting most in the fin 221 in the center.

An edge of the fin 221 in the center is located on the downstream side of a boundary between the first discharge surface 32 and the second discharge surface 42 (a position where the housing of the fan 3 and the housing of the fan 4 are in contact). The edge of the fin 221 in the center is located closest to the fans 3 and 4 and intervals between the edges of the other fins 22 and the fans 3 and 4 are wider than an interval between the fin 221 in the center and the fans 3 and 4. The edges of the fins 22 in other than the center farther away from the center are located farther from the first discharge surface 32 or the second discharge surface 42.

In this example, the fans 3 and 4 are disposed such that an angle formed by the first discharge surface 32 and the fin 221 in the center and an angle formed by the second discharge surface 42 and the fin 221 in the center are equal and an included angle between the first discharge surface 32 and the second discharge surface 42 is 90° or more. That is, the fans 3 and 4 are disposed such that an angle formed by the fin 221 in the center and the first discharge surface 32 or the second discharge surface 42 is 45° or more.

If the angles are set smaller, that is, if the included angle between the fan 3 and the fan 4 is set smaller than 90°, since an angle formed by a traveling direction of the air discharged by the fans 3 and 4 and the fins 22 increases and resistance in the air changing the air flowing direction along the fins 22 increases, the flow of the air tends to be disturbed. Accordingly, the included angle between the fan 3 and the fan 4 is desirably 90° or more.

The fin 221 in the center functions as a wall extending in the height direction (the Z-axis direction) between the position between the fan 3 and the fan 4 and the center position in the width direction of the heat sink 2 (the X-axis direction). The air blown by the fan 3 and the air blown by the fan 4 are separated by the fin 221 in the center. An inconvenience of flows of the air blown by the fan 3 and the air blown by the fan 4 interfering with each other is avoided. With such structure, the air blown by the fan 3 and the air blown by the fan 4 are guided to the heat sink 2 without being mixed.

The edges opposed to the first discharge surface 32 or the second discharge surface 42 of the fins 22 in this example respectively include end faces substantially parallel to the thickness direction (the X-axis direction). The air blowing direction of the fans 3 and 4 in this example is not parallel to a Y axis but is inclined with respect to the Y axis. Therefore, the end faces of the edges of the fins 22 explained above are inclined with respect to an air discharging direction from the first discharge surface 32 or the second discharge surface 42 and are not orthogonal to the air discharging direction. Accordingly, the air blown by the fan 3 and the air blown by the fan 4 do not collide with the end faces of the fins 22 to be blocked.

If the edges of the fins 22 did not project in the ridge shape, since the air blown by the fan 3 and the air blown by the fan 4 collide with each other in the center in the width direction, the flow would be disturbed. In this case, flow velocity is likely to inconveniently decrease.

However, in this example, since the edges of the fins 22 are projected in the ridge shape, the air blown by the fan 3 and the air blown by the fan 4 are prevented from being mixed and, at the same time, the edges of the fins 22 do not have orthogonal surfaces opposed to the first discharge surface 32 or the second discharge surface 42. Therefore, it is possible to improve stability of the flow of the air in the duct 1.

Subsequently, the example illustrated in FIG. 6 is explained. In the explanation of this example, explanation of portions common to the example illustrated in FIG. 5 is omitted and different portions are explained.

In this example, the included angle between the first discharge surface 32 and the second discharge surface 42 is 180°. That is, the angle formed by the fin 221 in the center and the first discharge surface 32 or the second discharge surface 42 is 90°.

In a heat sink 201 in this example, the edges opposed to the first discharge surface 32 or the second discharge surface 42 of the fins 22 respectively include the end faces inclined with respect to the thickness direction (the X-axis direction). The air blowing direction of the fans 3 and 4 in this example is parallel to the Y-axis direction. Therefore, the end faces of the edges of the fins 22 explained above are inclined with respect to the air discharging direction from the first discharge surface 32 or the second discharge surface 42 and is not orthogonal to the air discharging direction. Accordingly, the air blown by the fan 3 and the air blown by the fan 4 do not collide with the end faces of the fins 22 to be blocked.

The example explained above does not deny that the fan 3 and the fan 4 are installed in a state in which the included angle exceeds 180°. That is, the included angle between the fan 3 and the fan 4 may be set larger than 180° (up to, for example, approximately 200°).

Subsequently, the example illustrated in FIG. 7 is explained. In the explanation of this example, explanation of portions common to the example illustrated in FIG. 6 is omitted and different portions are explained.

In a heat sink 202 in this example, the edges on the side opposed to the first discharge surface 32 and the second discharge surface 42 of the fins 22 are located along a W-shaped imaginary line projecting in the center and both the ends in the arranging direction of the fins 22 (the X-axis direction). In other words, the edges on the side opposed to the first discharge surface 32 and the second discharge surface 42 of the fins 22 are located to draw a W shape formed by projecting the fins 22 in the center and at both the ends.

With the heat sink 202 in this example, the sum of the surface areas of the fins 22 can be set larger than that of the heat sink 201 in the example illustrated in FIG. 6. Therefore, it is possible to obtain the heat sink 202 having higher heat radiation power.

In the examples explained above, the fans 3 and 4 are disposed symmetrically with respect to the heat sink 2. However, in implementation, the disposition of the fans 3 and 4 is not limited to this. The fans 3 and 4 may not be symmetrically disposed with respect to the heat sink 2.

Since the fans 3 and 4 suck, from the suction port 11, the air to be blown against the heat sink 2, an air current occurs in a position facing the suction port 11. Heat generated by components located near the suction port 11 is carried and taken away by the air current. That is, a flow of the air formed by the fans 3 and 4 is considered to facilitate heat radiation of not only the heat source that is in contact with the base section 21 of the heat sink 2 but also the components near the suction port 11.

Accordingly, the fans 3 and 4 may be disposed with intention to facilitate heat radiation of components around the fans 3 and 4.

As explained above, the cooling device 200 in the embodiment includes the fan (the first air blowing unit) 3, the fan (the second air blowing unit) 4, the heat sink 2, and the duct 1. The fan 3 forms a flow of air by rotating to blow the air and includes the first discharge surface 32 for discharging the air. The fan 4 forms a flow of the air by rotating to blow the air, includes the second discharge surface 42 for discharging the air, and is installed adjacent to the fan 3. The duct 1 covers the heat sink 2, the fan 3, and the fan 4 and includes the suction port 11 on the upstream side in the air blowing direction by the fans 3 and 4 and the exhaust port 12 on the downstream side in the air blowing direction. The heat sink 2 has width smaller than the sum of the diameter of the first discharge surface 32 and the diameter of the second discharge surface 42, the plurality of fins 22 being erected side by side in the thickness direction in the base section 21 of the heat sink 2 to which the heat of the electronic component such as the CPU 102 conducts. Edges on the upstream side in the air blowing direction of the fins 22 are opposed to the first discharge surface 32 or the second discharge surface 42. The edge of the fin 221 in the center located on the downstream side of the boundary between the first discharge surface 32 and the second discharge surface 42 is located closer to the first discharge surface 32 and the second discharge surface 42 than the edges of the other fins 22.

With the structure explained above, the cooling device 200 can perform the air blow to the heat sink 2 with the plurality of fans 3 and 4 and can direct, with the fin 221 in the center further projecting than the other fins 22, the flows of the air blown from the fan 3 and the air blown from the fan 4 toward the heat sink 2 without causing the flows to interfere with each other. Consequently, in cooling the heat sink 2 with the two fans 3 and 4 in which the sum of the diameters of the discharge surfaces 32 and 42 is larger than the width of the heat sink 2, it is possible to suppress a loss of energy and efficiently cool the heat sink 2. Accordingly, even if a large-diameter fan cannot be used because of, for example, the height of the housing 110 of the electronic equipment 100, by adopting a plurality of fans 3 and 4 that supply an air volume equivalent to that of the large-diameter fan in cooperation with one another, it is possible to realize a reduction in the size of (reduce the height direction dimension of) the cooling fans without reducing a discharge volume of cooling wind.

The fans 3 and 4 in the embodiment explained above have the same size. However, in implementation, the sizes of the plurality of fans 3 and 4 do not always need to be the same. Outputs (wind velocities and air volumes to be obtained) of the fans 3 and 4 may be different.

While several embodiments are explained above, these embodiments are presented as examples and are not intended to limit the scope of invention. These new embodiments can be implemented in other various forms. Various omissions, substitutions, and changes can be made in a range not departing from the gist of the invention. These embodiments and modifications thereof are included in the scope and the gist of the invention and included in the inventions described in the claims and a scope of equivalents of the inventions.

What is claimed is:

1. A cooling device of electronic equipment, comprising:
   a first air blowing component configured to produce a flow of air by rotating to blow the air, the first air blowing component including a first discharge surface for discharging the air;
   a second air blowing component configured to produce a flow of the air by rotating to blow the air, the second air blowing component including a second discharge surface for discharging the air, and installed adjacent to the first air blowing component;
   a heat sink configured to include a base section to which heat of an electronic component conducts and a plurality of fins standing side by side in a thickness direction in a base section of the heat sink, the heat sink having a width smaller than a sum of a first diameter of the first discharge surface and a second diameter of the second discharge surface, edges of the fins on an upstream side in an air blowing direction by the first blower and the second blower being opposed to the first discharge surface or the second discharge surface, and the edges of the fins located on a downstream side in the air blowing direction of a boundary between the first discharge surface and the second discharge surface located closer to the first discharge surface and the second discharge surface than the other edges of the fins; and a duct covering the heat sink, the first air blowing component, and the second air blowing component and including a suction port on the upstream side and an exhaust port on the downstream side in the air blowing direction by the first air blowing component and the second air blowing component.

2. The cooling device according to claim 1, wherein the edges opposed to the first discharge surface or the second discharge surface of the fins are located along a ridge-shaped imaginary line projecting in a center in an arranging direction of the plurality of fins.

3. The cooling device according to claim 1, wherein the edges opposed to the first discharge surface or the second discharge surface of the fins have end faces inclined with respect to a discharging direction of the air from the first discharge surface or the second discharge surface.

4. The cooling device according to claim 1, wherein an included angle between the first discharge surface and the second discharge surface is 90° or more and 200° or less.

5. The cooling device according to claim 1, wherein the heat sink is fixed by helical springs and screws on frames formed in layers at a predetermined interval.

6. The cooling device according to claim 1, wherein the first air blowing component is a first fan and the second air blowing component is a second fan.

7. The cooling device according to claim 1, wherein the heat sink comprises at least one of aluminum and copper.

8. The cooling device according to claim 1, wherein the plurality of fins are positioned with respect to one another in a predetermined interval.

9. The cooling device according to claim 1, wherein the first diameter and the second diameter are substantially equal.

10. The cooling device according to claim 1, wherein the first diameter and the second diameter are different.

11. An electronic apparatus, comprising:

an electronic component; and a cooling device comprising:

a first air blowing component configured to produce a flow of air by rotating to blow the air, the first air blowing component including a first discharge surface for discharging the air;

a second air blowing component configured to produce a flow of the air by rotating to blow the air, the second air blowing component including a second discharge surface for discharging the air, and installed adjacent to the first air blowing component;

a heat sink configured to include a base section to which heat of an electronic component conducts and a plurality of fins standing side by side in a thickness direction in a base section of the heat sink, the heat sink having a width smaller than a sum of a first diameter of the first discharge surface and a second diameter of the second discharge surface, edges of the fins on an upstream side in an air blowing direction by the first blower and the second blower being opposed to the first discharge surface or the second discharge surface, and the edges of the fins located on a downstream side in the air blowing direction of a boundary between the first discharge surface and the second discharge surface located closer to the first discharge surface and the second discharge surface than the other edges of the fins; and a duct covering the heat sink, the first air blowing component, and the second air blowing component and including a suction port on the upstream side and an exhaust port on the downstream side in the air blowing direction by the first air blowing component and the second air blowing component.

12. The electronic apparatus according to claim 11, wherein the edges opposed to the first discharge surface or the second discharge surface of the fins are located along a ridge-shaped imaginary line projecting in a center in an arranging direction of the plurality of fins.

13. The electronic apparatus according to claim 11, wherein the edges opposed to the first discharge surface or the second discharge surface of the fins have end faces inclined with respect to a discharging direction of the air from the first discharge surface or the second discharge surface.

14. The electronic apparatus according to claim 11, wherein an included angle between the first discharge surface and the second discharge surface is 90° or more and 200° or less.

15. The electronic apparatus according to claim 11, wherein the heat sink is fixed by helical springs and screws on frames formed in layers at a predetermined interval.

16. The electronic apparatus according to claim 11, wherein the first air blowing component is a first fan and the second air blowing component is a second fan.

17. The electronic apparatus according to claim 11, wherein the heat sink comprises at least one of aluminum and copper.

18. The electronic apparatus according to claim 11, wherein the plurality of fins are positioned with respect to one another in a predetermined interval.

19. The electronic apparatus according to claim 11, wherein the first diameter and the send diameter are substantially equal.

20. The electronic apparatus according to claim 11, wherein the electronic apparatus is a personal computer and the electronic component is a CPU.

* * * * *